US 6,749,009 B2

(12) United States Patent
Barten

(10) Patent No.: US 6,749,009 B2
(45) Date of Patent: Jun. 15, 2004

(54) FOLDED FIN ON EDGE HEAT SINK

(75) Inventor: Brian Leslie Barten, Lockport, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/079,197

(22) Filed: Feb. 20, 2002

(65) Prior Publication Data

US 2003/0155103 A1 Aug. 21, 2003

(51) Int. Cl.$^7$ .................................................. H05K 7/20
(52) U.S. Cl. ...................... 165/80.3; 165/131; 165/185; 174/16.3; 257/722; 361/704
(58) Field of Search ................................ 165/80.3, 185, 165/131; 174/16.3; 257/722; 361/704

(56) References Cited

U.S. PATENT DOCUMENTS

| 1,766,701 A | * | 6/1930 | Blackmore | 165/185 |
| 1,997,058 A | * | 4/1935 | Hart | 165/131 |
| 4,777,560 A | * | 10/1988 | Herrell et al. | 165/80.3 |
| 4,796,692 A | * | 1/1989 | Szucs et al. | 165/131 |
| 5,205,353 A | * | 4/1993 | Willemsen et al. | 165/185 |
| 5,421,406 A | * | 6/1995 | Furusawa et al. | 165/185 |
| 5,727,622 A | * | 3/1998 | Gurevich et al. | 165/80.3 |
| 6,453,987 B1 | * | 9/2002 | Cheng | 165/80.3 |

FOREIGN PATENT DOCUMENTS

| JP | 56019643 A | * | 2/1981 | 165/185 |
| JP | 57083044 A | * | 5/1982 | 165/185 |
| JP | 61263140 A | * | 11/1986 | 165/80.3 |

* cited by examiner

Primary Examiner—Leonard R Leo
(74) Attorney, Agent, or Firm—Patrick M. Griffin

(57) ABSTRACT

A heat sink for cooling electrical or electronic devices comprises a spreader plate having a top surface and having a bottom surface for attaching to the electronic device. A folded fin formed from a strip of heat conducting material comprising alternating planar portions and curved portions has one edge abutted to the top surface such that the curved portions extend upwardly from the top surface substantially at a right angle.

11 Claims, 2 Drawing Sheets

FOLDED FIN ON EDGE HEAT SINK

TECHNICAL FIELD

The present invention is directed to heat sinks in general, and more particularly heat sinks for use in dissipating waste heat generated by electrical or electronic components and assemblies.

BACKGROUND

High power electrical and electronic components continue to have an increasing demand for higher power dissipation within a relatively confined space. In order to provide for such higher power dissipation requirements while remaining suitably compact, several levels of thermal management are usually required at the device, sub-assembly and component level.

At the component level, various types of heat exchangers and heat sinks have been used that apply natural or forced convection or other cooling methods. One type of heat sink for electrical or electronic components employs a spreader plate that has a folded fin attached thereto that can be formed from a continuous strip of metal in an accordion style. The folded fin is placed on the top surface of the spreader plate such that the folds of the folded strip are abutted to the top surface of the spreader plate and then typically affixed to the spreader plate by metallurgical bonding. An electric fan is then placed in proximity to the side of the heat sink and air is either drawn or blown through the passages formed by the fins and convolutions.

There are certain inefficiencies associated with this type of design, the primary inefficiency being that the air flow does not necessarily contact all flat surfaces of the folded fin. Thus a folded fin heat sink is desired that is easy to fabricate and assemble while also providing for improved airflow and thermal conductivity away from the electronic device being cooled.

SUMMARY OF THE INVENTION

One aspect of the present invention is a heat sink for cooling electrical or electronic devices. The heat sink comprises a spreader plate having a top surface and having a bottom surface for attaching to the electronic device. A folded fin formed from a strip of heat conducting material comprising alternating planar portions and curved portions has one edge abutted to the top surface such that the curved portions extend upwardly from the top surface substantially at a right angle.

Another aspect of the present invention is a method of fabricating a heat sink for electrical or electronic devices. The method comprising the steps of providing a spreader plate having a top surface and a bottom surface and further having opposing sides and producing a plurality of slots in the top surface of the spreader plate wherein the slots extend between the opposing sides of the spreader plate. A folded fin is formed wherein the folded fin has a plurality of alternating curved portions and planar portions. The edges of the planar portions are inserted into the slots such that one planar portion of the folded fin is inserted in each slot in the spreader plate and that the curved portions extend beyond the opposing sides and then affixing the planar portions to the spreader plate.

Yet another aspect of the present invention is a method of fabricating a heat sink for electrical or electronic devices comprising the steps of providing a spreader plate having a top surface and a bottom surface and further having opposing sides and forming a folded fin wherein the fin has a plurality of alternating curved portions and planar portions. One side of the folded fin is placed on spreader plate such that the planar and curved portions are substantially perpendicular to the top surface. The folded fin is then affixed to the spreader plate.

These and other advantages of the invention will be further understood and appreciated by those skilled in the art by reference to the following written specification, claims and appended drawings.

DETAILED DESCRIPTION OF THE PREFERRED EMBODIMENT

Figure 1:
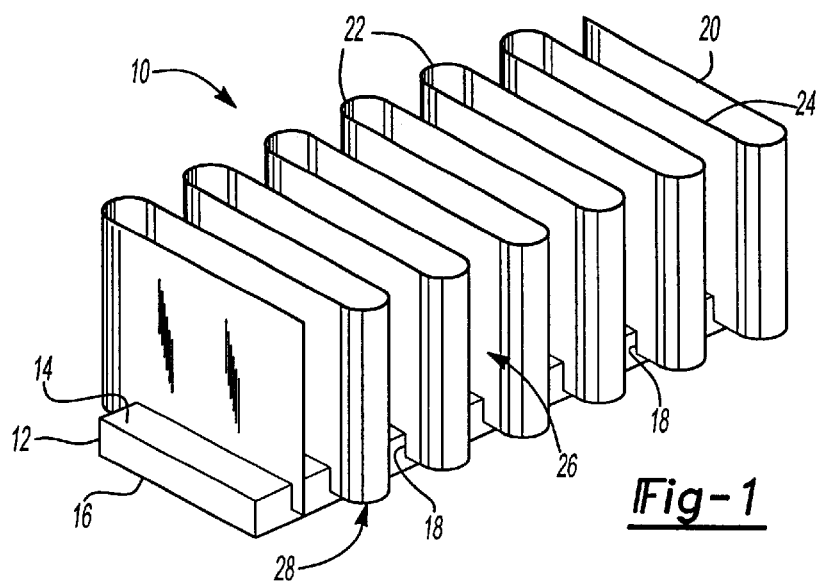
FIG. 1 is a perspective view of a heat sink embodying the present invention, wherein a folded fin is mounted thereto on edge.

For purposes of description herein, the terms "upper", "lower", "left", "rear", "right", "front", "vertical", "horizontal", and derivatives thereof shall relate to the invention as oriented in FIG. 1. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 2:
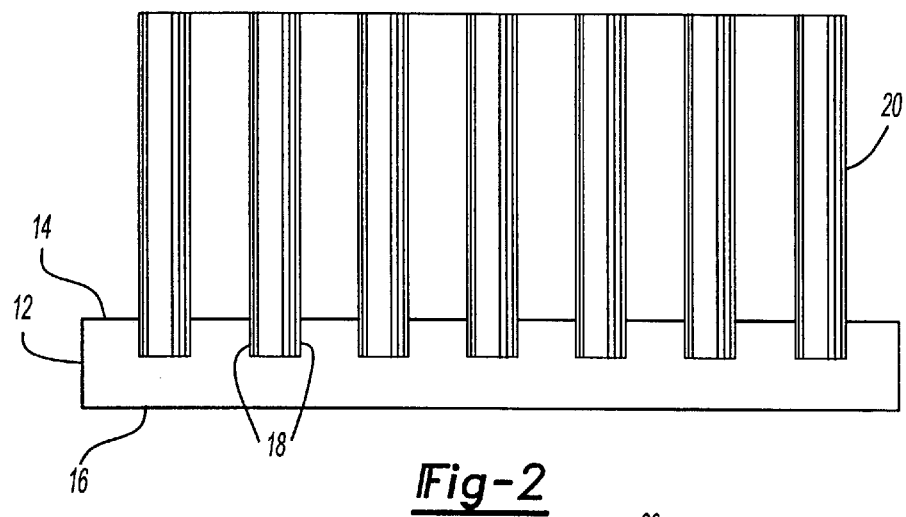
FIG. 2 is an elevational view of the heat sink of FIG. 1.
Figure 3:
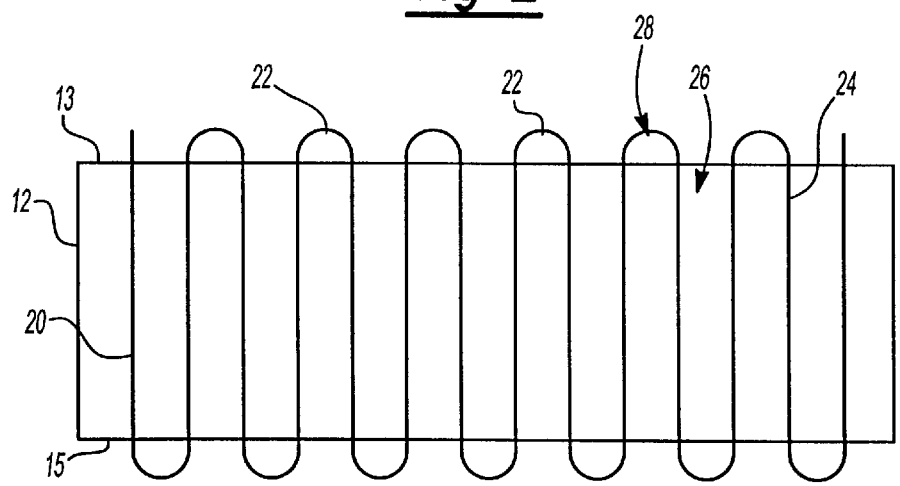
FIG. 3 is a plan view of the heat sink shown in FIG. 1.

Turning to the drawings, FIGS. 1–3 shows a heat sink 10, which is one of the preferred embodiments of the present invention and illustrates its various components.

Heat sink 10 comprises a spreader plate 12 have a bottom surface 16 to which an electronic or electrical device (not shown) is to be affixed utilizing a 'thermal grease' to enhance thermal conductivity between the device and spreader plate 12. The manner and method of attaching an electrical device to a spreader plate is well known in the art and therefore is not described in further detail herein. A top surface 14 of spreader plate 12 defines a plurality of slots extending between opposing sides 13, 15 of spreader plate 12. Slots 18 can be parallel one to the other as shown in FIGS. 1–3, or be slightly angled one with respect to the other in alternating "V" fashion.

A folded fin 20 is formed from a strip of heat conductive material such as aluminum, copper, graphite, aluminum nitride ceramic, or other similar material. Folded fin 20 has a plurality of alternating planar portions 24 and curved portions 22 to form a substantially convoluted accordion-style fin. The folded fin 20 is placed on its edge such that the curved portions 22 are substantially perpendicular to and extend upwardly from spreader plate 12. The bottom edge of each planar portion 24 is received in a slot 18 in spreader plate 12 such that each corresponding curved portion extends beyond opposing sides 13, 15 of spreader plate 12. The edges of planar portions 24 can be affixed in slots 18 by metallurgically bonding or with a thermally conductive adhesive to insure a heat conductive path from spreader plate 12 to folded fin 20.

Heat sink 10, thus provides a heat sink having substantially rigid fins as a result of the alternating curved portions 22 interconnecting alternatingly adjacent planar portions 24. An airflow or other cooling fluid can be directed over folded fin 20 to contact both sides of planar portions 24 and can be directed away from folded fin 20 through first and second fluid passage 26, 28.

Figure 4:
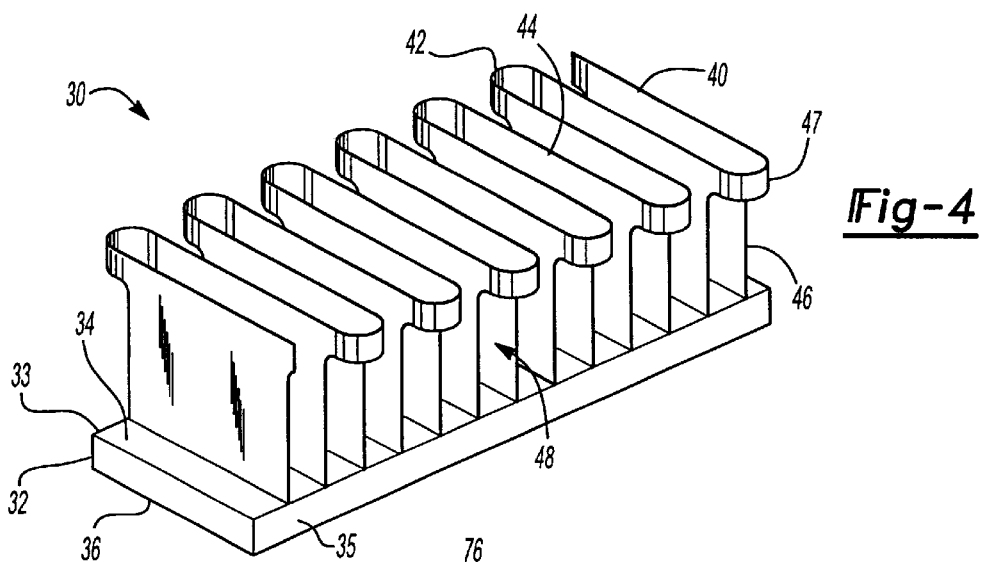
FIG. 4 is an alternate embodiment wherein only a portion of the fin folds connects the fins.

Turning now to FIG. 4, an alternate embodiment heat sink 30 is illustrated. Heat sink 30 is similar to heat sink 10 in that a spreader plate 32 has a bottom surface to which an electrical device to be cooled is affixed, and a top surface 34 upon which a folded fin 40 is attached. Folded fin 40 is formed like the previous folded fin 20 and is placed on its side such that an edge of each planar portion 44 abuts top surface 34. The folded fin 40 is affixed to the spreader plate 32 by adhesive bonding or by metallurgically bonding such as brazing, soldering, welding, or other similar process well known in the art. In this embodiment, a lower segment 46 of folded fin 40 has the curved portions associated therewith removed to provide fluid passageways 48 in place thereof to enhance the flow of cooling fluid or air across planar portions 44. A preferred method of removing the lower curved portions is accomplished by making an appropriate cutting of the base strip stock prior to folding fin 40. An upper portion 47 of folded fin 40 retains curved portions 42 to provide rigidity of folded fin 40. The width of folded fin 40 can be such that curved portions 42 remain within the boundary of opposing sides 33 and 35.

Alternatively, top surface 34 can define a plurality of slots (similar to slots 18 in spreader plate 12 above) extending between opposing sides of spreader plate 32 for receiving edges of planar portions 44 in each of the slots. As another alternative, folded fin 40 can be formed without the curved portions removed and attached to spreader plate 32 as above. After attachment of folded fin 40 to spreader plate 32, the desired areas of curved portions 42 can be machined away to form fluid passageways 48 while retaining upper portions 47 to provide the desired structural rigidity.

Figure 5:
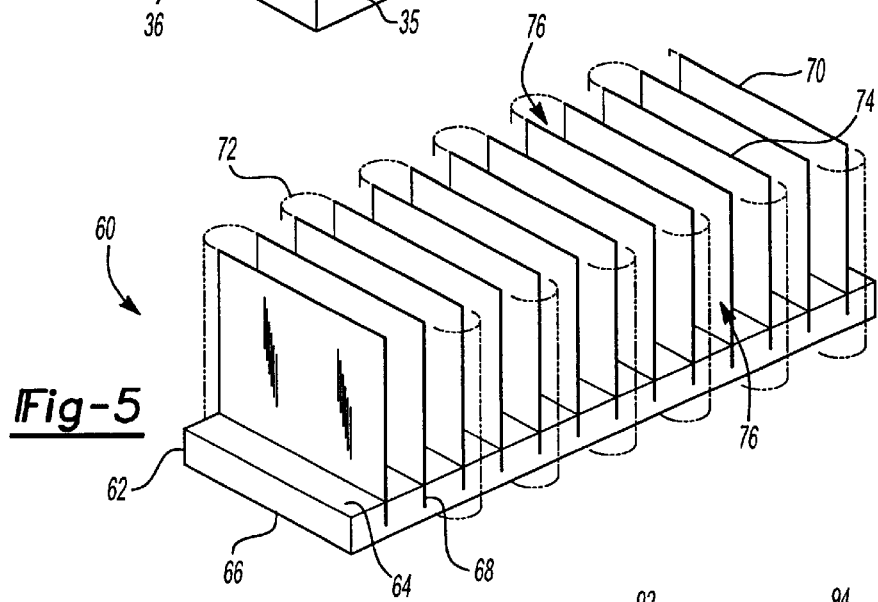
FIG. 5 is another embodiment of a heat sink according to the present invention wherein the folds of the folded fin are completely machined off.

FIG. 5 shows another alternate embodiment heat sink 60 similar to heat sink 30 in that spreader plate 62 has a bottom surface to which an electrical device to be cooled is affixed, and a top surface 64 defines a plurality of slots 68 extending between opposing sides of spreader plate 62. A folded fin 70 is formed like the previous folded fin 20 and is placed on its side such that an edge of each planar portion 64 is received in each of slots 68. The folded fin 70 is affixed to the spreader plate 62 by adhesive bonding or by metallurgically bonding. In this embodiment, once the folded fin 70 is affixed to spreader plate 62, each of the curved portions 72 are machined off or removed in other similar manner to provide individually extending planar portions extending upwardly from spreader plate 62 substantially in a perpendicular manner. In this manner each pair of adjacent planar portions defines a like fluid passage 76 at each of the opposing sides of spreader plate 62. Forming the folded fin 70 in an accordion like manner, affixing it on the spreader plate 62, and after it has been affixed, removing the folded or curved portions 72 is an efficient method of assembly, since individual planar portions 64 do not require alignment and individual insertion in spreader plate 62.

Figure 6:
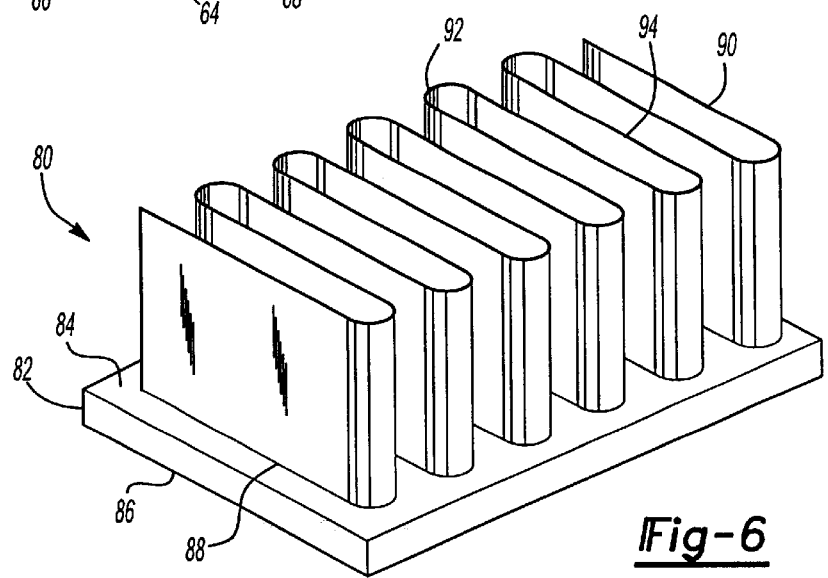
FIG. 6 is an embodiment wherein the folds of the folded fin do not extend beyond the sides of the spreader plate.

A last alternative embodiment heat sink 80 is illustrated in FIG. 6, wherein spreader plate 82 has a bottom surface to which an electrical device to be cooled is affixed, and a top surface 84. A folded fin 90 is formed in a like accordion manner as previously discussed folded fins including curved portions 92 and planar portions 94. The folded fin 90 is placed on its side and has edge 88 abutted to top surface 84 of spreader plate 82. The width of spreader plate 82 compared to the width of folded fin 90 is such that curved portions 92 of folded fin 90 remain within the opposing sides of spreader plate 82. Folded fin 90 is affixed to top surface 84 of spreader plate 82 by adhesive bonding or metallurgically bonding edge 88 to top surface 84.

In the foregoing description those skilled in the art will readily appreciate that modifications may be made to the invention without departing from the concepts disclosed herein. Such modifications are to be considered as included in the following claims, unless these claims expressly state otherwise.

I claim:

1. A heat sink for cooling electrical or electronic devices, said heat sink comprising:

a spreader plate having a top surface and a bottom surface, wherein said top surface defines a plurality of slots therein extending between opposing sides of said spreader plate; and a folded fin formed from a strip of heat conducting material, said folded fin further comprising alternating planar portions and, curved portions, wherein said alternating planar portions include a length that extends fully between said alternating curved portions, and wherein an edge of each of said planar portions extends straight between said curved portions of said folded fin and continuously along said length with said straight edge of each of said planar portions being received in one of said slots, such that said curved portions extend upwardly from said top surface substantially at a right angle and said curved portions extend beyond said opposing sides of said spreader plate.

2. The heat sink according to claim 1 wherein said planar portions are substantially parallel one to another.

3. The heat sink according to claim 1 wherein said planar portions are substantially perpendicular to said top surface of said spreader plate.

4. The heat sink according to claim 1 wherein a bottom segment of said folded fin is most proximate to said spreader plate and a top segment is most distal from said spreader plate, and further wherein said curved portions are associated with said top segment and said bottom segment is devoid of said curved portion.

5. The heat sink according to claim 1 wherein a bottom segment of said folded fin is most proximate to said spreader plate and a top segment is most distal from said spreader plate.

6. The heat sink according to claim 5 wherein each adjacent pair of said planar portions proximate to said bottom segment define air passages therebetween at each of said opposing edges of said spreader plate.

7. The heat sink according to claim 6 wherein said planar portions are substantially parallel one to another.

8. The heat sink according to claim 6 wherein said planar portions are substantially perpendicular to said top surface of said spreader plate.

9. The heat sink according to claim 6 wherein said planar portions are affixed in said slots by metallurgical bonding.

10. The heat sink according to claim 6 wherein said curved portions are associated with said top segment and said bottom segment is devoid of said curved portion.

11. The heat sink according to claim 1 wherein said edge of each of said planar portions is further defined as a bottom edge and said planar portions further include a top edge opposite said bottom edge with said bottom edge being parallel to said top edge.

\* \* \* \* \*